(12) United States Patent
Banerjee et al.

(10) Patent No.: US 8,866,201 B2
(45) Date of Patent: Oct. 21, 2014

(54) HIGH-VOLTAGE TRANSISTOR DEVICE WITH INTEGRATED RESISTOR

(75) Inventors: Sujit Banerjee, San Jose, CA (US); Vijay Parthasarathy, Mountain View, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/385,264

(22) Filed: Feb. 10, 2012

(65) Prior Publication Data
US 2012/0146105 A1 Jun. 14, 2012

Related U.S. Application Data

(63) Continuation of application No. 12/583,426, filed on Aug. 20, 2009, now Pat. No. 8,129,815.

(51) Int. Cl.
| | |
|---|---|
| *H01L 29/66* | (2006.01) |
| *H01L 29/808* | (2006.01) |
| *H01L 27/06* | (2006.01) |
| *H01L 49/02* | (2006.01) |
| *H01L 29/06* | (2006.01) |
| *H01L 29/10* | (2006.01) |

(52) U.S. Cl.
CPC .......... *H01L 29/808* (2013.01); *H01L 27/0629* (2013.01); *H01L 28/20* (2013.01); *H01L 29/0634* (2013.01); *H01L 29/1058* (2013.01); *H01L 29/1066* (2013.01)
USPC .................... 257/272; 257/E27.016

(58) Field of Classification Search
CPC ............ H01L 27/0605; H01L 29/0696; H01L 29/7802; H01L 29/0634; H01L 29/7813
USPC .......................................... 257/272, E27.016
See application file for complete search history.

(56) References Cited

U.S. PATENT DOCUMENTS

| | | | |
|---|---|---|---|
| 5,282,107 | A | 1/1994 | Balakrishnan |
| 5,285,369 | A | 2/1994 | Balakrishnan |
| 5,977,763 | A | 11/1999 | Loughmiller et al. |
| 6,128,241 | A | 10/2000 | Choi |
| 6,388,853 | B1 | 5/2002 | Balakrishnan et al. |
| 6,449,207 | B2 | 9/2002 | Sher et al. |
| 6,630,724 | B1 | 10/2003 | Marr |
| 6,635,544 | B2 | 10/2003 | Disney |
| 6,640,435 | B2 | 11/2003 | Balakrishnan |
| 6,668,451 | B2 | 12/2003 | Balakrishnan |
| 6,693,481 | B1 | 2/2004 | Zheng |
| 6,750,640 | B2 | 6/2004 | Balakrishnan et al. |
| 6,954,057 | B2 | 10/2005 | Balakrishnan et al. |
| 6,987,299 | B2 | 1/2006 | Disney et al. |

(Continued)

*Primary Examiner* — Tony Tran
(74) *Attorney, Agent, or Firm* — The Law Offices of Bradley J. Bereznak

(57) ABSTRACT

A high-voltage device structure comprises a resistor coupled to a tap transistor that includes a JFET in a configuration wherein a voltage provided at a terminal of the JFET is substantially proportional to an external voltage when the external voltage is less than a pinch-off voltage of the JFET. The voltage provided at the terminal being substantially constant when the external voltage is greater than the pinch-off voltage. One end of the resistor is substantially at the external voltage when the external voltage is greater than the pinch-off voltage. When the external voltage is negative, the resistor limits current injected into the substrate. It is emphasized that this abstract is provided to comply with the rules requiring an abstract that will allow a searcher or other reader to quickly ascertain the subject matter of the technical disclosure.

10 Claims, 3 Drawing Sheets

(56) References Cited

U.S. PATENT DOCUMENTS

| | | |
|---|---|---|
| 7,002,398 B2 | 2/2006 | Disney |
| 7,170,756 B2 | 1/2007 | Balakrishnan |
| 7,205,824 B2 | 4/2007 | Disney |
| 7,221,011 B2 | 5/2007 | Banerjee et al. |
| 7,227,733 B2 | 6/2007 | Balakrishnan et al. |
| 7,308,754 B2 | 12/2007 | Balakrishnan |
| 7,335,944 B2 | 2/2008 | Banerjee et al. |
| 7,336,095 B2 | 2/2008 | Erickson et al. |
| 7,400,483 B2 | 7/2008 | Balakrishnan et al. |
| 7,932,738 B1 | 4/2011 | Banerjee et al. |
| 7,998,817 B2 | 8/2011 | Disney |
| 2003/0218924 A1 | 11/2003 | Duval et al. |
| 2006/0092742 A1 | 5/2006 | Paillet et al. |
| 2006/0214221 A1* | 9/2006 | Challa et al. .......... 257/328 |
| 2008/0122006 A1* | 5/2008 | Williams et al. ....... 257/371 |
| 2009/0166797 A1* | 7/2009 | Kim et al. .............. 257/500 |
| 2010/0163990 A1 | 7/2010 | Ko |
| 2010/0301412 A1 | 12/2010 | Parthasarathy et al. |
| 2011/0272758 A1 | 11/2011 | Banerjee et al. |
| 2013/0181723 A1 | 7/2013 | Mauder et al. |

* cited by examiner

US 8,866,201 B2

HIGH-VOLTAGE TRANSISTOR DEVICE WITH INTEGRATED RESISTOR

This application is a continuation of application Ser. No. 12/583,426, filed Aug. 20, 2009, entitled, "High-Voltage Transistor Device With Integrated Resistor", which is assigned to the assignee of the present application.

TECHNICAL FIELD

The present disclosure generally relates to the field of high-voltage device structures.

BACKGROUND

High-voltage, field-effect transistors (HVFETs) are well known in the semiconductor arts. Many HVFETs employ a device structure that includes an extended drain region that supports or "blocks" the applied high-voltage (e.g., 200 volts or more) when the device is in the "off" state. HVFETs of this type are commonly used in power conversion applications such as AC/DC converters for offline power supplies, motor controls, and so on. These devices can be switched at high voltages and achieve a high blocking voltage in the off state while minimizing the resistance to current flow in the "on" state. The extended drain region of a typical HVFET is usually lightly doped to support high voltages applied to the drain when the device is off. The length of the extended drain region is also increased as compared to a conventional low-voltage MOSFET to spread the electric field over a larger area so the device can sustain higher voltages. When the device is on (i.e., conducting) current flows through the extended drain region.

In a vertical HVFET structure, a mesa of semiconductor material forms the extended drain or drift region for current flow in the on-state. A trench gate structure is formed near the top of the substrate, adjacent the sidewall regions of the mesa where the body region is disposed. Application of an appropriate voltage potential to the gate causes a conductive channel to be formed along the vertical sidewall portion of the body region such that current may flow vertically through the semiconductor material, i.e., from a top surface of the substrate where the source region is disposed, down to the bottom of the substrate where the drain region is located.

Conventional power integrated circuit (IC) devices often employ a large vertical high-voltage output transistor in a configuration wherein the drain of the transistor is coupled directly to an external pin. The IC typically includes a controller circuit formed on a semiconductor die or chip that is separate from the semiconductor die that includes the high-voltage output transistor. Both semiconductor chips (the controller and output transistor) are usually housed in the same IC package. To provide start-up current for the controller circuit of the IC, a high external voltage may be applied to the external pin. The controller is typically protected from the high externally-applied voltage limited by a junction field-effect transistor (JFET) "tap" structure. For example, when the drain of the high voltage output transistor is taken to, say 550V, the tap transistor limits the maximum voltage coupled to the controller to approximately 50V, thereby providing a small (2-3 mA) current for start-up of the device. However, a problem with this type of circuit configuration occurs when the drain pin goes negative, as commonly happens in some power supply configurations. The negative swing on the drain of the vertical output HVFET can inject a large amount of minority carriers into the substrate, which can cause latch-up of the controller.

BRIEF DESCRIPTION OF THE DRAWINGS

The present invention is illustrated by way of example, and not limitation, in the figures of the accompanying drawings, wherein.

DESCRIPTION OF EXAMPLE EMBODIMENTS

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the embodiments described.

It should be understood that the elements in the figures are representational, and are not drawn to scale in the interest of clarity. It is also appreciated that although an IC utilizing N-channel transistor devices are disclosed, P-channel transistors may also be fabricated by utilizing the opposite conductivity types for all of the appropriate doped regions. Furthermore, those of skill in the art of high-voltage semiconductor devices will understand that transistor structures such as those shown by way of example in the figures may be integrated with other transistor device structures, or otherwise fabricated in a manner such that different devices share common connections and semiconductor regions (e.g., N-well, substrate, etc.).

In the context of the present application a high-voltage or power transistor is any semiconductor transistor structure that is capable of supporting approximately 150V or more in an "off" state or condition. In one embodiment, a high-voltage output transistor is illustrated as an N-channel metal-oxide-semiconductor field-effect transistor (MOSFET) with the high-voltage being supported between the source and drain regions. In other embodiments, a high-voltage output transistor may comprise a bipolar junction transistor (BJT), an insulated gate field effect transistor (IGFET), or other device structures that provide a transistor function.

For purposes of this disclosure, "ground" or "ground potential" refers to a reference voltage or potential against which all other voltages or potentials of a circuit or IC are defined or measured.

In the context of the present disclosure a tap transistor is a transistor device structure in which a voltage at a first or tap terminal is substantially proportional to an applied voltage across the second and third terminals when the applied voltage is less than a pinch-off voltage of the transistor device. When the applied voltage across the second and third terminals exceeds the pinch-off voltage, the voltage provided at the tap terminal is substantially constant or unchanging with increased applied voltage. In one embodiment, a tap transistor comprises a junction field-effect transistor (JFET).

Figure 1:
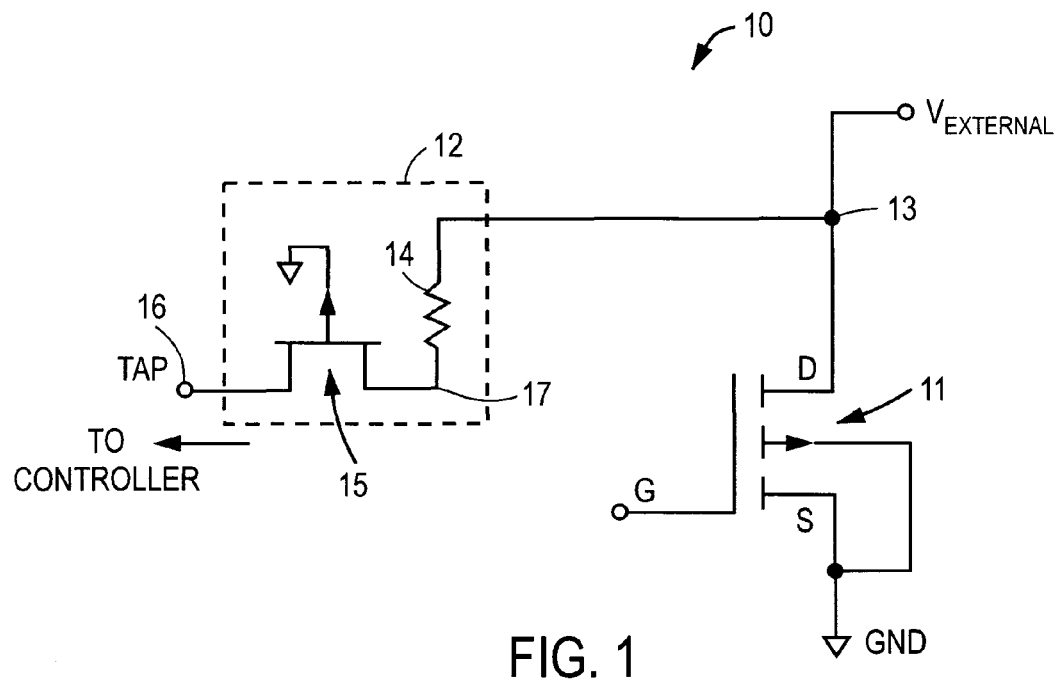
FIG. 1 illustrates an example circuit schematic diagram of an output section of a power integrated circuit (IC).

FIG. 1 illustrates an example circuit schematic diagram of an output section 10 of a power integrated circuit (IC) which comprises a large, vertical N-channel HVFET 11 having a gate, a source coupled to ground, and a drain coupled to an external pin or node ($V_{EXTERNAL}$) 13. A control voltage applied to the gate determines the voltage state (e.g., high or low) at node 13. Current may flow to one or more external loads connected to node 13 when HVFET 11 is conducting, i.e., in the on-state. In a switch-mode power supply IC, for example, output transistor 11 may control the current through the primary winding of a transformer, thereby controlling the power delivered by the power supply.

FIG. 1 also shows an integrated high-voltage device structure 12 which, in the embodiment shown, comprises a tap transistor 15 that has its gate grounded, and its drain (node 17) coupled to an integrated high-voltage resistor 14. The source (node 16) of tap transistor 15 provides the tap voltage to the internal controller of the IC, which, according to one implementation, may be limited to approximately 50V. The internal controller circuitry (not shown) and device structure 12 may be formed on a semiconductor die that is separate from the semiconductor die that includes output transistor 11.

In the example of FIG. 1, resistor 14 comprises a small (e.g., ~100 ohm) resistor integrated in a high-voltage device structure which comprises tap transistor 15. Resistor 14 is made of polysilicon formed on top of a thick layer of field oxide. In order to sustain high voltages, resistor 14 is disposed on the field oxide directly over an N-well region of tap transistor 15 (see FIG. 3). The drain pad metal of tap transistor 15 is connected to one end of resistor 14, i.e., node 17, with the other end of resistor 14 being connected to the drain of HVFET 11, i.e., node 13.

During operation of the power IC device, when the drain (node 13) of vertical HVFET 11 transitions to a negative voltage, resistor 14 limits the current that flows to the controller, thereby preventing latch-up of the internal controller circuitry. The value of resistor 14 may be determined based on the maximum current that can be tolerated in the controller section of the IC before latch-up occurs. For example, if the power IC device is able to tolerate current up to 10 mA, and assuming in a worst case scenario that the drain of HVFET 11 can transition to a negative voltage of about −1V, then resistor 14 should have a resistance value of 100 ohms.

Practitioners in the art will appreciate that when node 13 transitions to a positive voltage of, say 550V, both terminal ends of resistor 14 (i.e., nodes 13 & 17) float up to substantially the same high voltage level. That is, only a relatively small voltage potential difference appears across resistor 14 between nodes 13 and 17. For example, one end of resistor 14 coupled to node 13 may be at 550V; whereas the other end of resistor 14 coupled to node 17 may be at about 549.8V. Note that the drain metal electrode of HVFET 11 and the N-well of the underlying tap transistor structure are also at substantially the same potential as that of the end of resistor 14 coupled to node 13. In this state (i.e., off-state), the substrate beneath the N-well, and the gate of the tap transistor, are at or near ground potential.

The controller circuitry draws startup current (e.g., ~2 mA) from node 13 through tap transistor 15 and resistor 14. When this occurs, the voltage drop across resistor 14 (assuming a 100 ohm resistance) is about 0.2V, which is negligible compared to the available voltage.

Figure 2:
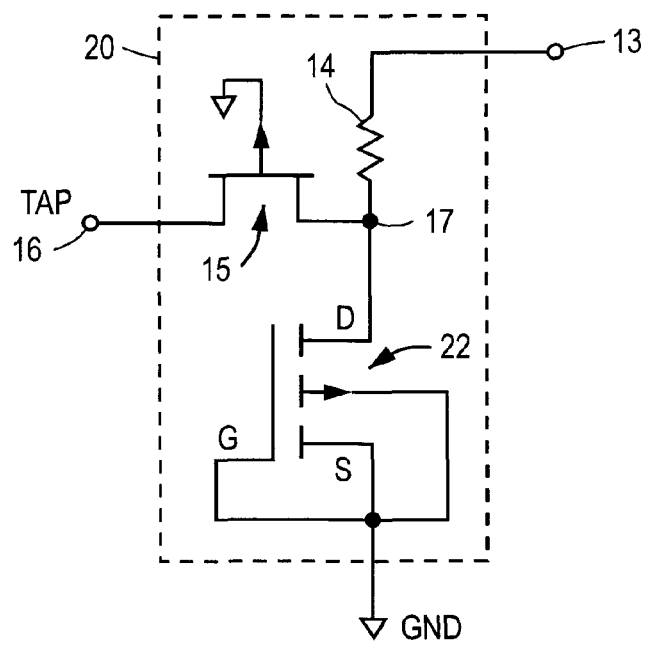
FIG. 2 illustrates an example equivalent circuit schematic diagram of an alternative integrated high-voltage device structure for use in the power IC of FIG. 1.

FIG. 2 illustrates an example equivalent circuit schematic diagram of an alternative integrated device structure 20. Device structure 20 may be used as an alternative to device structure 12 in the power IC of FIG. 1. Device structure 20 comprises a tap transistor 15 connected at node 17 with integrated resistor 14 in the same basic circuit configuration shown in FIG. 1. Node 16, which is the source of transistor 15, provides the tap voltage to the controller section of the power IC. Node 17 is the drain of tap transistor 15, which is connected to one end of resistor 14.

Also connected to node 17 is the drain of a high-voltage MOSFET 22, which is shown configured with its source, body region, and gate grounded. In a normal operating condition, transistor 22 is off, i.e., non-conducting. In one embodiment, high-voltage MOSFET 22 and tap transistor 15 are fabricated such that both devices share the same N-well region formed in a P-type substrate. In the example of FIG. 2, it should be understood that transistor 15, resistor 14 and -voltage MOSFET 22 are disposed on a semiconductor die that is separate from the semiconductor die that includes output transistor 11.

Figure 3:
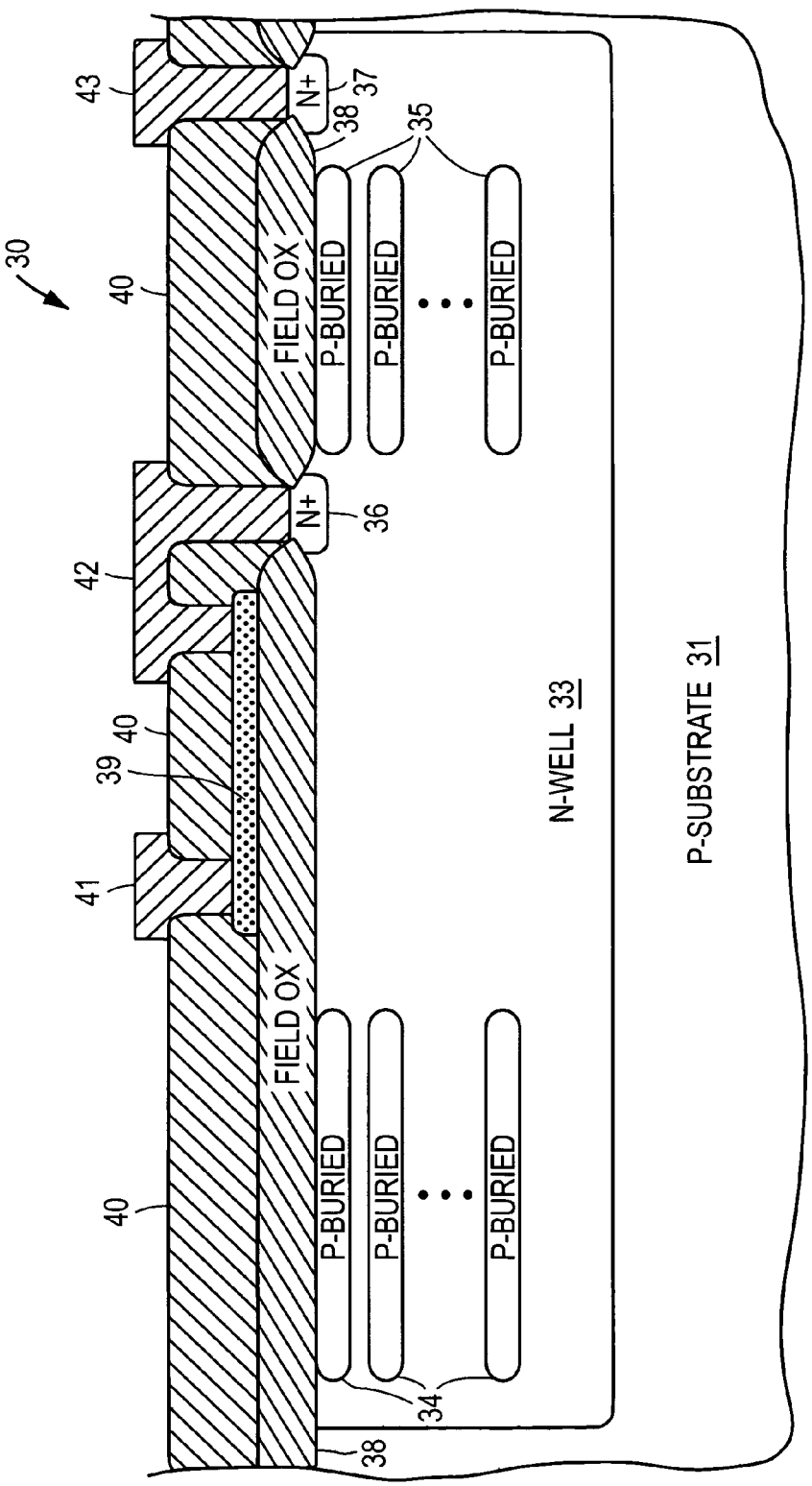
FIG. 3 illustrates an example cross-section of the integrated high-voltage device structure shown in FIGS. 1 & 2.

FIG. 3 illustrates an example cross-section 30 of the integrated high-voltage device structure shown in FIGS. 1 & 2. In this example, a tap transistor is integrated with a high-voltage resistor 39, the latter comprising a polysilicon layer formed on a section of field oxide region 38 that overlays an area of N-well region 33 that does not include any P-type buried regions. That is, resistor 39 is disposed directly above an area of N-well 33 that is devoid of P-type buried regions. This structural arrangement limits the voltage that appears across field oxide 38 directly beneath resistor 39 when a high voltage potential is applied to electrode or terminal 41, which is coupled to the drain of high-voltage output transistor 11.

As can be seen, a plurality of substantially parallel spaced-apart P-type buried regions 34 are shown disposed in the left-hand area of N-well 33, laterally-adjacent to the area directly underneath resistor 39. The uppermost buried region 34 is shown coincident with field oxide region 38. The right-hand area of N-well 33 comprises the tap JFET structure, which includes a plurality of substantially parallel spaced-apart P-type buried regions 35 disposed beneath a section of field oxide region 38 formed between N+ regions 36 and 37.

Note that in this embodiment, the P-type buried regions 34 or 35 do not extend beneath N+ regions 36 or 37. An interlayer dielectric layer 40 is formed over portions of field oxide regions 38 and resistor layer 39. Electrode 41 provides electrical connection to one end of layer 39 through interlayer dielectric layer 40. Via openings in interlayer dielectric layer 40 allow electrode 42 to electrically connect to one end of layer 39 and also to N+ region 36 (node 17 in FIGS. 1 & 2). Electrode 43 provides electrical connection to N+ region 37 (node 16) via openings in interlayer dielectric layer 40 and field oxide region 38.

Practitioners in the semiconductor arts will appreciate that the P type buried regions 35 comprise the gate of the JFET structure. A deep implant (not shown) or any other type of equivalent structure may be used to electrically connect to one end of each of buried regions 35. For example, in FIG. 3, the left-hand-most end of P type buried regions 35 is grounded. A similar structure may be utilized to electrically connect to each of buried regions 34. This allows the gate of the JFET structure which comprises the tap transistor to be electrically connected to a potential at or near ground as shown in FIGS. 1 & 2.

In the off-state, the end of each of the P type buried regions 35 not grounded (i.e., the end closest to region 37) floats up to the maximum voltage, e.g., substantially the same voltage appearing at electrode 43, which is the drain of output transistor 11. In this configuration, the high external voltage applied to node 13 is dropped laterally across the each of the P type buried layers 35. Hence, the actual voltage on the JFET gate (P type buried regions) varies in a lateral direction from drain (region 37) to the source (region 36) of the JFET structure.

In one embodiment of the device structure shown in FIG. 3, field oxide 38 is formed to a thickness of approximately 5000-10000 angstroms over N-well region 33 and P-substrate region 31. Practitioners in the art will appreciate that when polysilicon resistor layer 39 floats to a maximum applied high voltage potential at electrode 41 (>500V) the thickness of field oxide 38 insufficient to support that voltage reliably over long period of time. It is further appreciated that when polysilicon layer 39 is at a high voltage (e.g., 500-700V), the underlying P-substrate region 31 is typically grounded. In this state, the voltage is dropped across the P-type buried layers 34 & 35 such that the N-well region 33 under the polysilicon resistor floats up to substantially the same voltage potential as that of polysilicon resistor layer 39. This ensures that the voltage potential across the field oxide (between polysilicon layer 39 and the underlying N-well region 33) is relatively small.

In the example cross-section of FIG. 3, electrodes or terminals 41, 42 and 43 correspond to nodes 13, 17 and 16, respectively, of FIGS. 1 and 2. As discussed above, with P-substrate 31 and P-buried regions 34 & 35 connected to ground, the voltage at electrode 43 (the tap) is proportional to the voltage at electrode 42 up to a certain pinch-off voltage. If the voltage at electrode 42 exceeds the pinch-off voltage, the voltage at electrode 43 remains relatively constant at a tap potential considerably less than the maximum voltage that may appear at electrodes 41 and 42. In this manner, the integrated high-voltage device structure shown in FIG. 3 protects the low-voltage circuitry (e.g., in the controller section) of the power transistor IC from the high voltages appearing at electrode 41.

Persons of skill in the semiconductor arts will appreciate that the tap transistor portion of the integrated high-voltage device structure shown in FIG. 3 comprises a junction field effect transistor (JFET) having a drain (N+ region 36 connected to electrode 42), a gate (P-type buried regions 35 and P-substrate 31) which are typically tied to ground (through a connection not shown), and a source (N+ region 37 connected to electrode 43) serving as a tap terminal or node, which provides voltage to the other circuitry disposed in P-substrate 31. In the embodiment shown in FIG. 2, the JFET comprising tap transistor 15 is integrated with high-voltage MOSFET 22; that is, tap transistor 15 and high-voltage MOSFET 22 share a common N-well region.

Continuing with the example embodiment of FIG. 3, the uppermost ones of each of the P-type buried regions 34 and 35 are shown embedded within N-well 33 at the surface of the substrate, i.e., coincident with or adjacent to field oxide 38. Each of the remaining ones of the P-type buried regions 34 & 35 are vertically separated so as to create a plurality of JFET conduction channels in N-well 33. In the embodiment of FIG. 3 the number of JFET channels is equal to the number of P-type buried regions 35.

Regions 34 & 35 may be formed, for example, by high-energy ion implantation. This results in an N-well region 33 that is divided into multiple JFET conduction channels interleaved with P-buried regions 34 (beneath layer 39) and P-buried regions 35 (between N+ regions 36 & 37). It is appreciated that N-well 33 may also be formed by high-energy ion implantation. The implant energies and doses may be chosen in order to keep the maximum electric field at the N-well-P-buried layer junction below the critical electric field at which avalanche breakdown occurs. In one embodiment, the maximum charge in P-buried regions 34 & 35 and each of the JFET channels is about $1-2 \times 10^{12}/cm^2$. Those of ordinary skill in the art will appreciate that to form N-well region 33 with a plurality of JFET conduction channels, the doping and implant energy levels of the N-well and the plurality of P-buried regions may be chosen to approximate the above-described charge levels.

During normal operation of the power IC of FIG. 1, when the voltage difference between electrodes 42 & 43 is low, current flows from terminal 42 to terminal 43 through the JFET conduction channels in N-well 33. As the voltage at terminal 43 is increased, the free charge carrier concentration in N-well 33 is depleted by its reverse bias to P-type substrate 31 and P-type buried regions 35. When the voltage difference between electrode 42 and P-type substrate 31 reaches a certain voltage (i.e. the pinch-off voltage), the JFET conduction channels are fully depleted of free charge carriers by the reverse bias. Above this pinch-off voltage, the resistance of the N-well 33 between electrodes 42 and 43 increases dramatically, such that the voltage at electrode 43 is substantially fixed at the pinch-off voltage. In one embodiment, pinch-off occurs at approximately 40-50V.

It should be further understood that when electrode 41 is at a high positive voltage of, say, 550V, both ends of polysilicon resistor layer 39 (i.e., electrodes 41 and 42) float up to substantially the same high voltage. For example, when a voltage of 550V appears at electrode 41, electrode 42 may be at a voltage potential of about 549.8V, depending on the resistance value of resistor layer 39 and the current flow through resistor layer 39 and transistor 15. The N-well region 33 directly beneath resistor layer 39 is also at substantially the same high potential as electrode 42. When the controller section of the IC draws startup current (e.g., 2 mA) from electrode 41, a small, negligible voltage drop (e.g., ~0.2V) occurs across resistor layer 39 between electrodes 41 & 42.

Although the uppermost P-type buried regions 34 & 35 are illustrated in FIG. 3 as being disposed at the upper surface of the N-well region 33, in other embodiments the uppermost P-type buried regions may be formed just below the upper surface of the N-well region 33, thereby creating a JFET conduction channel at the surface just below field oxide 38.

In another embodiment, instead of having a plurality of P-type buried regions, only a single P-type buried region 34 and a single P-type buried region 35 are formed on opposite sides of N-well 33.

In one embodiment, field oxide regions 38 comprises silicon dioxide formed using a variety of well-known methods, including thermal growth and chemical vapor deposition. It is appreciated that in other embodiments field oxide regions 38 may comprise silicon nitride or other suitable dielectric materials. Similarly, interlayer dielectric layer 40 may comprise silicon dioxide, silicon nitride, or other suitable dielectric materials.

Figure 4:
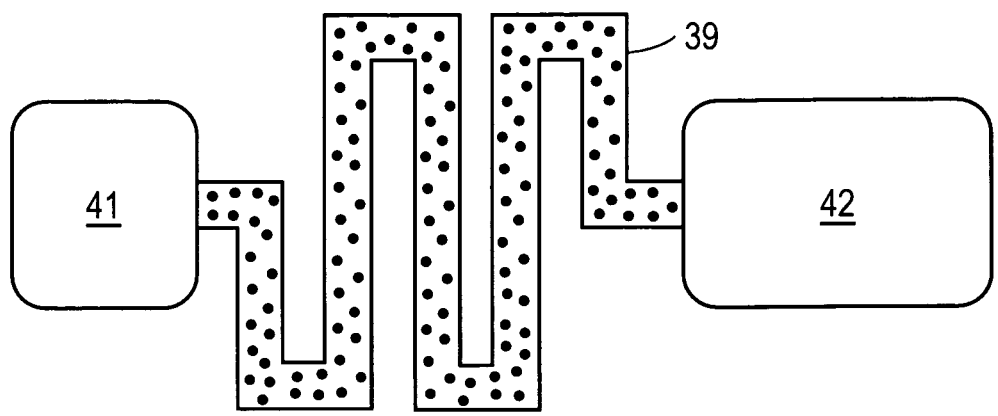
FIG. 4 illustrates an example top, layout view of the integrated high-voltage device structure shown in FIG. 3.

FIG. 4 illustrates an example top, layout view of the integrated high-voltage device structure shown in FIG. 3. Note that resistor 39 is shown formed in a serpentine configuration that minimizes the spacing between terminals 41 & 42.

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

We claim:

1. A power integrated circuit (IC) device comprising:
   a substrate of a first conductivity type;
   a well region of a second conductivity type disposed in the substrate, the well region having first, second, and third areas, the first area being laterally adjacent to the second area, and the second area being laterally adjacent to the third area, the second area laterally and physically separating the first area from the third area;
   a JFET disposed in the first area of the well region, the JFET including:

first and second regions of the second conductivity type; and one or more first buried regions of the first conductivity type, the one or more first buried regions defining a plurality of conduction channels that extend substantially across the first area, the first region being disposed at one end and the second region being disposed at an opposite end, of the conduction channels;

a dielectric layer formed over at least the second area of the well region, the second area extending vertically from the dielectric layer to a bottom of the well region, the second area being devoid of any buried region of the second conductivity type;

a layer of material formed as a resistor over the dielectric layer directly above the second area, the resistor having first and second ends;

first and second electrodes, the first electrode being electrically and physically connected to the first end, and the second electrode being electrically and physically connected to the second end, of the resistor, the second electrode also being electrically connected to the second region;

a third electrode electrically connected to the first region;

a fourth electrode electrically connected to the substrate and to the one or more first buried regions, wherein a voltage provided at the third electrode is substantially proportional to a voltage difference between the second and fourth electrodes when the voltage difference is less than a pinch-off voltage of the JFET, the voltage provided at the third electrode being substantially constant when the voltage difference is greater than the pinch-off voltage of the JFET.

2. The power IC device of claim 1 further comprising a plurality of vertically spaced-apart second buried regions of the first conductivity type disposed in the third area of the well region.

3. The power IC device of claim 2 wherein the one or more second buried regions are electrically connected to the fourth electrode.

4. The power IC device of claim 1 wherein the dielectric layer comprises a field oxide layer.

5. The power IC device of claim 1 wherein the layer of resistive material comprises a polysilicon resistor.

6. The power IC device of claim 1 wherein when the first electrode is at a high voltage greater than 100 volts and the fourth electrode is at or near a ground potential, the second area is at a voltage substantially the same as the high voltage.

7. The power IC device of claim 1 wherein the layer of resistive material floats at a potential substantially equal to the voltage difference when the voltage difference is greater than the pinch-off voltage of the JFET.

8. The power IC device of claim 1 wherein the one or more first buried regions comprise a plurality of buried regions, the conduction channels being defined between each of the first buried regions, and also between a bottommost one of the first buried regions and the substrate.

9. The power IC device of claim 1 wherein the one or more first buried regions comprise a single first buried region of the first conductivity type with the conduction channels being defined above and below the single first buried region.

10. The power IC device of claim 1 wherein the one or more first buried regions are separated from both the first and second regions.

* * * * *